United States Patent [19]

Duvvury et al.

[11] Patent Number: 4,598,389
[45] Date of Patent: Jul. 1, 1986

[54] SINGLE-ENDED CMOS SENSE AMPLIFIER

[75] Inventors: Charvaka Duvvury, Missouri City; Russel W. Strawn, Houston, both of Tex.

[73] Assignee: Texas Instruments Incorporated, Dallas, Tex.

[21] Appl. No.: 656,283

[22] Filed: Oct. 1, 1984

[51] Int. Cl.$^4$ .............................................. G11C 11/40
[52] U.S. Cl. .................................... 365/208; 365/189; 307/530
[58] Field of Search ............... 365/205, 207, 208, 222, 365/210, 189; 307/530

[56] References Cited

U.S. PATENT DOCUMENTS

| | | | |
|---|---|---|---|
| 4,004,284 | 1/1977 | Heeren | 365/222 |
| 4,270,190 | 5/1981 | Jindra et al. | 365/208 |
| 4,434,381 | 2/1984 | Stewart | 365/208 |

OTHER PUBLICATIONS

Lambrechtse et al., "A 4096 Bit One Transistor per Bit RAM with Internal Timing and Low Dissipation", IEEE ISSCC Digest of Tech. Papers, Feb. 14, 1973, pp. 26–27.

Primary Examiner—James W. Moffitt
Assistant Examiner—Glenn A. Gossage
Attorney, Agent, or Firm—John G. Graham

[57] ABSTRACT

A semiconductor dynamic read/write memory device having an array of rows and columns of one-transistor cells employs a single-ended sense amplifier connected to a whole column line, rather than a differential sense amplifier having two inputs connected to column line halves. The single-ended sense amplifier includes an input circuit responsive to a selected threshold voltage, and the output of the amplifier is coupled back to the column line. A dummy cell circuit applies a fixed charge to the column line, so the threshold is exceeded if the selected memory cell stores a 1, but not if a zero is stored.

9 Claims, 2 Drawing Figures

SINGLE-ENDED CMOS SENSE AMPLIFIER

BACKGROUND OF THE INVENTION

This invention relates to semiconductor memory devices and more particularly to an improved sense amplifier for a CMOS dynamic read/write memory.

Dynamic MOS memory devices have heretofore used bistable differential sense amplifiers which have inputs connected to balanced bit lines, each bit line being half of a column. Dummy cells establish a reference voltage on the unselected bit line. Sense amplifiers of this type are shown in U.S. Pat. No. 4,239,993 issued to McAlexander, White and Rao (a 64K-bit device), U.S. Pat. No. 4,081,701 issued to White, McAdams and Redwine (a 16K-bit device), and U.S. Pat. No. 3,940,747, issued to Kuo and Kitagawa (a 4K-bit device), all assigned to Texas Instruments.

The differential sense amplifiers previously used have required that the bit lines, latch transistors, dummy cells, active pull-up circuits, precharge devices, and all other elements associated with the bit lines and sense latch, be almost perfectly balanced. A slight imbalance in electrical or physical characteristics can result in unreliable data. For example, if the latch transistors are not balanced in threshold voltage and conduction factor, false data can be read.

A single-ended sense amplifier is disclosed in pending application Ser. No. 741,205, filed June 4, 1985 by David J. McElroy, assigned to Texas Instruments, which is a continuation of Ser. No. 445,813, now abandoned. It is the principal object of this invention to provide an improved sense amplifier for a low-power high-speed random access read/write memory, particularly for an array of dynamic one-transistor cells. Another object is to provide a sense amplifier which may be used in a dynamic memory array wherein the bit lines and sense amplifier elements are not required to be balanced and matched.

SUMMARY OF THE INVENTION

In accordance with one embodiment of the invention, a semiconductor dynamic read/write memory device having an array of rows and columns of one-transistor cells employs a single-ended sens amplifier connected to a whole column line, rather than a differential sense amplifier having two inputs connected to column line halves. The single-ended sense amplifier includes an input circuit responsive to a selected threshold voltage, and the output of the amplifier is coupled back to the column line. A dummy cell circuit applies a fixed charge to the column line, so the threshold is exceeded if the selected memory cell stores a 1, but not if a zero is stored.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
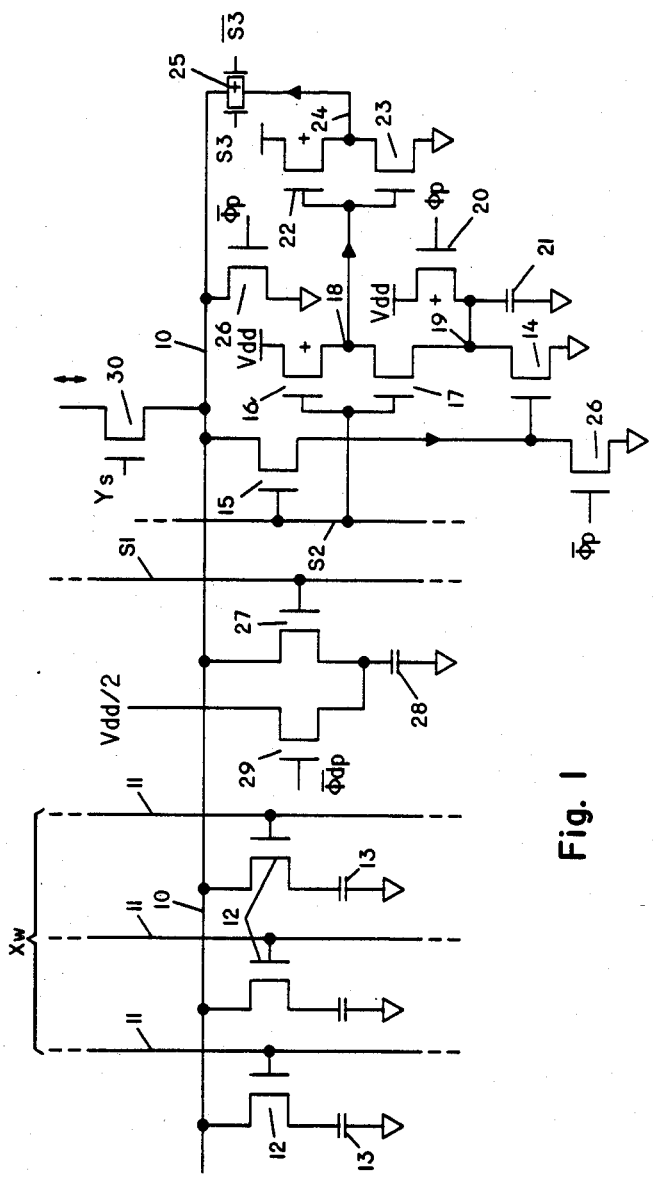
FIG. 1 is an electrical schematic diagram of a part of a memory array showing the single-ended CMOS sense amplifier circuit of the invention.

Referring to FIG. 1, a small part of a dynamic read/write memory device is shown, including a single-ended CMOS sense amplifier circuit according to the invention. A bit line 10 is intercepted by a number of word lines 11, and one-transistor cells are located at intersections of bit and word lines. Each cell includes an access transistor 12 and a storage capacitor 13. A 256K-bit memory device would have, for example, 256 word lines and 1024 bit lines. For each bit line, a sense amplifier is provided.

Figure 2:
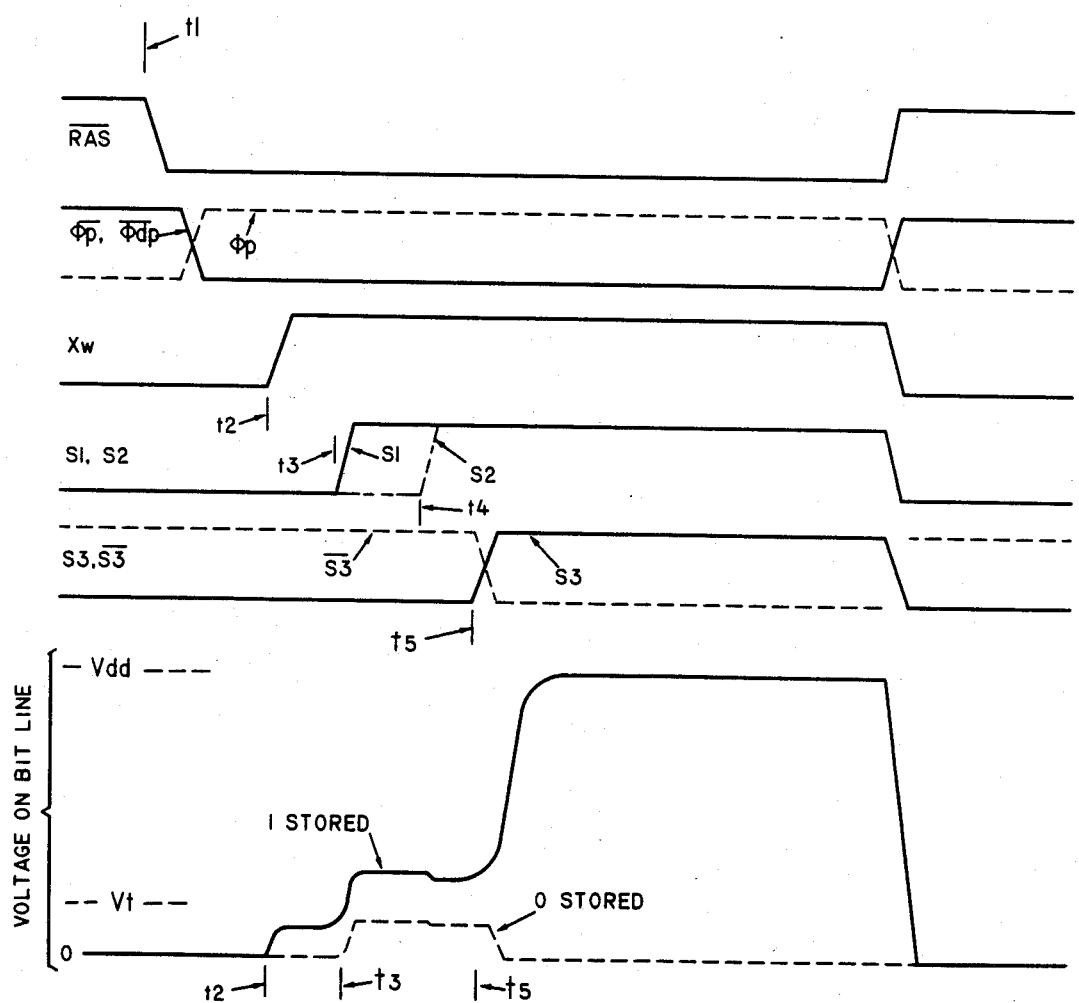
FIG. 2 is a graphic representation of voltage vs. time existing at various parts of the circuit of FIG. 1.

The sense amplifier includes an N-channel input transistor 14 having its gate connected to the bit line 10 by a coupling transistor 15. The source-drain path of the transistor 14 is connected in series with a P-channel transistor 16 and an N-channel transistor 17. All three of the transistors 15, 16 and 17 have a clock voltage S2 on their gates; the voltage waveforms are shown in FIG. 2. when S2 is at Vss, the P-channel transistor 16 is turned on and precharges an output node 18, then when S2 goes high, N-channel transistors 15 and 17 turn on the evaluate the bit line, and P-channel transistor 16 turns off. The drain node 19 of the input transistor 14 is precharged by a P-channel transistor 20 having a clock $\phi p$ on its gate, with a small capacitor 21 storing charge at this node. The output at node 18 is applied to the gates of a CMOS inverter and buffer having transistors 22 and 23, with the output 24 of this inverter being coupled back to the bit line 10 through a CMOS gate 25 having back-to-back N-channel and P-channel transistors with clock voltages S3 and $\overline{S3}$ on the gates.

The bit line 10 and the gate of the transistor 14 are both pre-discharged to Vss by N-channel transistors 26 having the clock voltage $\phi p$ on their gates. A dummy cell including an access transistor 27 and a capacitor 28 is coupled to the bit line when clock voltage S1 goes high (seen in FIG. 2). This dummy capacitor 28 is precharged to Vdd/2 (usually +2.5 v) by a transistor 29 when clock voltage $\phi dp$ is high.

Data output for read operations, or data input for write operations, is through a transistor 30 which has a Y-select signal Ys on its gate. The signal Ys is an output of a column decoder selecting one-of-N columns.

In operation, when the memory device is accessed for a read, an address strobe $\overline{RAS}$ drops at time t1, and the precharge voltages $\phi p$, $\phi p$ and $\phi dp$ change state, as seen in FIG. 2. This leaves the bit line 10 at Vss, the dummy capacitor 28 at Vdd/2, and the node 19 at Vdd. Since S2 is low, the node 18 is also at Vdd, turning on transistor 23 and holding node 24 at Vss. Then, at time t2, one of the word lines 11 receives a row address voltage Xw, so the stored charge in the selected capacitor 13 is charge-shared with the bit line: the voltage level in the bit line 10 at this point depends upon whether a 1 or a 0 was stored in the cell. With the capacitor 28 precharged to +2.5 v, turning on S1 at time t3 will amplify the signal on the bit line 10. The size of the dummy capacitor 28 is chosen so that for a minimum 1 level of data (1.5 to 2.0 v) stored in the storage cell the amplified signal (after S1) corresponds to the Vt of the latch input transistor 14. Next, S2 is brought high at t4, transferring the signal to the gate of transistor 14 through the transistor 15. This will either turn on the transistor 14 for reading a 1 or leave it in a slow leakage condition when reading a 0. When reading a 1 the node 19 discharges so that its potential reaches a threshold Vt below the +5 v level of clock S2. The discharge rate of transistor 14 is controlled by the level capacitor 21. If the node 19 does go one Vt below 5 v, the node 18 starts to go low causing the node 24 to begin going high. Now, at time t5, the CMOS transfer gate 25 is turned on by S3 and S3. If the data being read is such that the node 24 has gone high (1 to 2 v) the regenerative feedback will clamp the bit line 10 at Vdd, +5 v. If the original signal on the bit line 10 was not sufficiently large, node 18 would remain high and node 24 at Vss, so when S3, S3 are activated the bit line 10 is quickly clamped to Vss through the transistor 23. For a given leakage rate as well as variations in Vt of the transistor 14, the level capacitor 21 can be chosen for an optimum differentiation between a 1 and a 0 level. At some delay after t5, the signal Ys goes high, and a data bit is coupled to the output of the chip through a standard output buffer.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A memory device comprising:
   an array of rows and columns of memory cells, a row line for each row of cells and a column line for each column of cells; each memory cell having an access transistor including a drain, a source-to-drain path, and a gate; the drain of each cell in a column being connected to said column line for the column and the gate of each cell being connected to said row line for the row,
   a plurality of single-ended sense amplifier circuits, one for each column, each one of said sense amplifier circuits being connected to a separate one of said column lines,
   each sense amplifier circuit including a detector circuit responsive to a given threshold voltage, the detector circuit having an input coupled to said column line for the respective volumn through a first coupling means, and an output from the detector circuit connected back to said column line through second coupling means,
   precharge means for precharging the column lines to a selected voltage prior to the beginning of an active cycle,
   dummy cell means for coupling a selected charge to each said column line at said beginning of an active cycle, said selected charge producing a voltage on said column line above said threshold if a 1 is stored in a selected memory cell, and below said threshold if a 0 is stored,
   row addressing means for applying an activating voltage to the gates of said access transistors in a selected row by one of said row lines at said beginning of an active cycle,
   and means for activating said first and second coupling means in sequence with a time delay after said beginning of an active cycle.

2. A device according to claim 1 wherein each said detector circuit includes an input transistor having a source-to-drain path and having a gate, said first coupling means including a coupling transistor having a source-to-drain path connecting the gate of the input transistor to said bit column line.

3. A device according to claim 2 wherein the memory cells are dynamic memory cells storing data on storage capacitors.

4. A device according to claim 3 wherein said detector circuit includes a P-channel and an N-channel transistor having source-to-drain paths connected in series between a voltage supply and the drain of said input transistor.

5. A device according to claim 4 wherein a clock voltage is applied to the gates of said coupling transistor and said P-channel and N-channel transistors to activate the first coupling means.

6. A semiconductor memory circuit comprising:
   a column line selectively connected to a memory cell at a first time in an operating cycle;
   a single-ended sense circuit having an input coupled to said column line at a second time in an operating cycle,
   said sense circuit having a given threshold voltage for said input below which it produces an output at a low voltage level and above which it produces an output at a high voltage level,
   coupling means for connecting said output of said sense circuit to the column line at a third time in an operating cycle,
   means for applying a fixed voltage level to said column line prior to said first time in an operating cycle,
   said fixed voltage level being below said threshold voltage of said sense circuit, said sense circuit responding at its input to the sum of said fixed voltage level and the voltage stored in the memory cell.

7. A circuit according to claim 6 wherein said means for applying a fixed voltage is a dummy cell having an access transistor and a dummy capacitor, and further comprising means for precharging said dummy capacitor to a reference voltage level.

8. A circuit according to claim 6 wherein said sense circuit includes a first stage functioning as a threshold detector, and a second inverter stage connected to receive an output of the first stage and producing said output of the sense circuit.

9. A circuit according to claim 8 wherein an output of said inverter stage is said output connected by said coupling means to the column line.

* * * * *